United States Patent
Lee

(10) Patent No.: US 7,427,899 B2
(45) Date of Patent: Sep. 23, 2008

(54) APPARATUS AND METHOD FOR OPERATING A VARIABLE SEGMENT OSCILLATOR

(75) Inventor: Wayne S. Lee, San Mateo, CA (US)

(73) Assignee: Matsushita Electric Industrial Co., Ltd., Osaka (JP)

(*) Notice: Subject to any disclaimer, the term of this patent is extended or adjusted under 35 U.S.C. 154(b) by 104 days.

(21) Appl. No.: 11/326,645

(22) Filed: Jan. 6, 2006

(65) Prior Publication Data

US 2007/0159261 A1    Jul. 12, 2007

(51) Int. Cl.
H03L 7/07        (2006.01)
H03L 7/087       (2006.01)

(52) U.S. Cl. .................... 331/11; 331/16; 327/156
(58) Field of Classification Search .......... 331/10, 331/11, 16; 327/156
See application file for complete search history.

(56) References Cited

U.S. PATENT DOCUMENTS 6,078,633 A * 6/2000 Shiotsu et al. ............ 375/374
7,154,342 B2 * 12/2006 Munker et al. ............. 331/11

* cited by examiner

Primary Examiner—Robert Pascall
Assistant Examiner—James E Goodley
(74) Attorney, Agent, or Firm—McDermott Will & Emery LLP

(57) ABSTRACT

This disclosure is directed to a communications device having a comparator that receives a signal associated with an output and produces a signal associated with a difference between a reference signal and the output signal. A loop filter is coupled to the comparator and accepts the difference signal. An oscillator is coupled to the loop filter and accepts the loop filter signal. It produces a signal with a frequency-characteristic in response. The oscillator can operate at a plurality of segments. A segment selection circuit is coupled to the oscillator. It determines which segment will be selected based upon a signal associated with an expected frequency characteristic, and outputs a signal associated with the particular segment. In response, the oscillator can then change its operational state to the particular segment. An amplification circuit is coupled to the oscillator, and produces an output signal with the particular frequency characteristic.

3 Claims, 8 Drawing Sheets

APPARATUS AND METHOD FOR OPERATING A VARIABLE SEGMENT OSCILLATOR

FIELD

The current application is directed to communications. In particular, this application is directed to an output oscillator having dynamically controlled output segments.

BACKGROUND

Contemporary communications systems often employ an oscillator to create an output signal or to downconvert a received signal. Many conventional communications systems employ a voltage controlled oscillator (VCO) for this oscillator function.

In these circuits, the VCO is part of a phase-lock loop or other type of frequency or phase characteristic control loop. In the loop, the output of the VCO is conventionally controlled by a loop filter. The output of the loop filter is in turn controlled by an error signal which indicates a difference between an expected output and an eventual output of the system.

A VCO having a single segment has its output governed by static reactances within its structure. Thus, the frequency range of the single segment VCO is strictly limited to one and only one range of output, and one and only one range of input control voltages.

A conventional VCO without multiple segments outputs a signal having a particular frequency (or other frequency or phase characteristic) across a specified voltage input at a particular input. Accordingly, if a frequency is required that is outside the range of the output voltage of the loop filter or outside the range of the single output segment of the VCO, the particular output cannot be realized.

In some conventional communications system, the VCO can be made with dynamically controlled, configured, or switched reactances, thus allowing the VCO to operate at a different range of output given the same range of input voltages. In this manner, several ranges of output are possible for the VCO within the same range of voltages provided by the loop filter.

FIG. 1 is a graph depicting an output frequency of a multi-segment VCO graphed against input voltages. In this graph, a VCO can produce several segments, each having a different frequency range output based upon a single range of input voltage. In this manner, if the VCO is preset to operate on a segment 1, the input voltages over the range will produce the frequencies as depicted on that segment 1.

To achieve larger ranges of output from the VCO, the path with reactive elements may be altered, or the values of some of the reactive elements within the VCO may be switched. Accordingly, this would drive the output frequencies for the same range of voltages to another segment 2. In this manner, the limitations of the voltage range of the loop filter need not be a limitation on an output frequency. Further, the full range of frequencies as depicted in the segments 1 through 4 may be obtained using a single output voltage range of the associated loop filter of the system.

However, the ability of a communications system to freely operate amongst the segments is limited. In many conventional systems, the functional components used to perform selection of a particular segment are independent of the components used in the generation of an output signal. Further, the ability of the segment selection components to efficiently select a proper segment can also be inefficient in the manner in which the segment is eventually selected.

FIG. 2 is a schematic block diagram of a conventional communications system employing a variable segment VCO. A communications device 10 has a segment selection circuit 12, a VCO 14, and a loop filter 16. Upon initiation of operation, the segment selection circuit 12 inputs a digital word to the VCO 14. The particular digital word presented to the VCO 14 actuates or shunts switches in the VCO 14, thereby initializing the VCO 14 to operate at a particular output segment.

In many conventional systems, the output of the VCO 14 on a particular segment is then tested against the output that is wished. In one configuration, the segment selection circuit 12 selects a particular segment, and then inputs a voltage to the VCO 14 corresponding to the floor voltage of the voltage range associated with normal operation. Next, the segment selection circuit 12 inputs a ceiling voltage to the VCO 14 corresponding to the high voltage of the voltage range associated with normal operation. If the required operating point lies between the two outputs of the VCO 14 at these two points, as measured by the segment selection circuit 12, the segment selection circuit 12 can determine that the currently input digital word indicates the proper segment at which the VCO 14 should operate.

If the operating point is found not to reside between the outputs of the floor input voltage and the ceiling input voltage, the segment selection circuit 12 then increments or decrements the digital word input into the VCO 14. In this manner a new segment is selected and the test is run again using the newly chosen segment. In this manner the system 10 performs a somewhat inefficient search to find the proper segment on which the VCO 14 should operate.

In another manner of operation, the testing of the segment can be done using only the center point frequency of the selected segment. However, this does not eliminate the inefficiency associated with the linear search method to find the proper segment.

In some other conventional communications systems a binary search could be employed to determine the proper operating segment. In this case the segment selection circuit 12 would indicate a center segment to test from the variable segments as an input into the VCO 14. If it is found that the operation point of the VCO 14 is higher than the currently selected segment, the input word denoting the presently selected segment is made a ceiling. Next, the input to the VCO 14 is changed to indicate the center segment of the remaining segments. In this manner a binary search can be employed to search for the proper operation segment of the VCO 14.

In some communications standards, a communications device is expected to operate at more than one output frequency. Some of these communications standards allow a limited time in which to change the operating point of the output. Accordingly, an inefficient search for the proper operation segment and for the proper operating point on the segment for the VCO 14 may be pressured to meet the specifications of such multi-channel, dual mode, or multi-mode systems.

As newer communications standards evolve, the operational standards also typically call for more efficient use of the transmission time, as well as having multiple modes or operating channels. Thus, a VCO that is not efficiently finding a proper operational segment is also pressured through the reduction in timing consideration as well as explosion in possible multiple outputs described above.

Further, many conventional communications systems operate the segment selection circuit's interaction with the VCO 14 without regard to the other components of the conventional transmission loops. Thus, in these conventional communications systems, while the segment selection circuit 12 is deriving the proper segment at which the VCO 14 is to operate, the loop filter 16 will be disabled. Only when the proper operational segment has been found, does the loop filter 16 become operational. Thus the operations of the segment selection circuit will result in the decoupling of the normal operation path in the frequency or phase characteristic control loop. In this manner, the operational path of the transmission system 10 will be completely disabled while the search function is occurring.

One will note that the combination of the segment selection circuit and the VCO can form a closed loop during the selection process. This conventional usage forces the searching and testing to shut down the operational components of a phase-lock loop during the selection process, after which the selection circuit is disabled and shut down.

BRIEF DESCRIPTION

This disclosure is directed to a communications device having a comparator that receives a signal associated with an output and produces a signal associated with a difference between a reference signal and the output signal. A loop filter is coupled to the comparator and accepts the difference signal. An oscillator is coupled to the loop filter and accepts the loop filter signal. It produces a signal with a frequency-characteristic in response. The oscillator can operate at a plurality of segments. A segment selection circuit is coupled to the oscillator. It determines which segment will be selected based upon a signal associated with an expected frequency characteristic, and outputs a signal associated with the particular segment. In response, the oscillator can then change its operational state to the particular segment. An amplification circuit is coupled to the oscillator, and produces an output signal with the particular frequency characteristic.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

DETAILED DESCRIPTION

Embodiments of the present invention are described herein in the context of an apparatus and method for operating a variable segment oscillator. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of digital systems, including hardware, software, or any combination thereof. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 3:
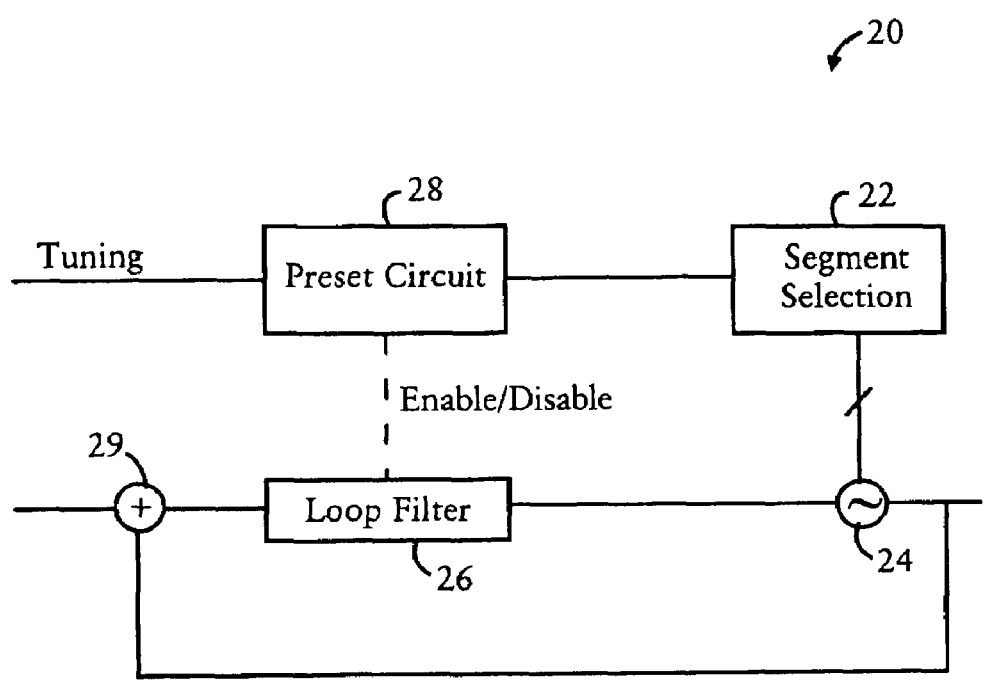
FIG. 3 is a schematic block diagram of a communications device employing a variable segment VCO, and operable to directly select a VCO segment.

FIG. 3 is a schematic block diagram of a communications device employing a variable segment VCO, and operable to directly select a VCO segment. A communications device 20 has a segment selection circuit 22 that inputs a digital word to a variable segment VCO 24. The output of the segment selection circuit determines at which segment the VCO 24 operates at. A loop filter 26 drives the VCO 24 with a voltage level output during normal operation. Also included is a preset circuit 28. In operation, the preset circuit 28 directs the segment select circuit 22 as to a particular segment to start the initial operation of the VCO 24 at. The preset circuit 28 is operable to disable the loop filter 26, and enable it at a later time.

To start, an incoming signal indicating an expected operating frequency is received by the preset circuit 28. This signal is used by the preset circuit 28 to compute an expected frequency segment to operate on, or to directly determine the initial expected operating segment. The preset circuit 28 then sends an indication of a particular segment selection to the segment selection circuit 22, which in turn inputs the proper signal to the VCO 24 to select the particular operating segment. During these initial operations, the loop filter 26 is disabled.

Upon the determination or selection of the proper segment at which the VCO 24 is to operate, the loop filter 26 is enabled and normal operations are initiated. At this point the path determined by the output of the VCO 24, the output of a comparator 29, and the output of the loop filter 26 serve as a phase-lock loop that allows the output of the communications device 20 to settle at a particular point based upon the normal principles of such phase-lock loops. In this manner most, if not all, searching for the proper segment in which to operate the VCO 24 is eliminated.

One should note that the aforementioned phase-lock loop may also be embodied as other operational components. The principles as applied to a phase-lock loop (as mentioned above and in other portions of this disclosure) may be applied equally to a frequency control loop, a Δ-phase control loop, a Δ-frequency control loop, derivatives thereof, or any other phase or frequency characteristic control loop that can control an output of an oscillator such as the VCO 24. Accordingly, the scope of this disclosure should not be limited in this regard, and that references to phase-lock loops or any other frequency or phase characteristic control loops may be properly interchanged. Additionally, references to phase, frequency, or other frequency-characteristics may also be construed to refer to alternative embodiments for the other frequency-characteristics not mentioned.

Figure 4A:
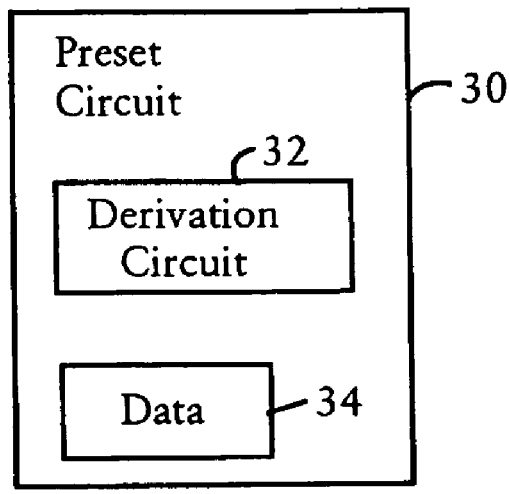
FIGS. 4a and 4b are possible embodiments of a preset circuit operable to be used in this description.
Figure 4B:
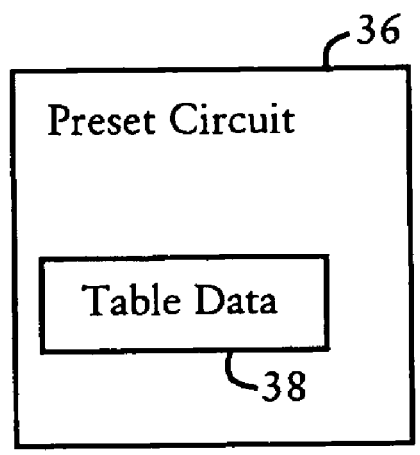

FIGS. 4a and 4b are possible embodiments of a preset circuit operable to be used in this description. FIG. 4a shows the use of a preset circuit using a lookup table to determine the operating segment for a VCO. FIG. 4b shows the use of a lookup table in conjunction with other circuitry to derive a proper segment.

Back to FIG. 3, the preset circuit 28 may operate in any number of different manners such as those described above. In one embodiment, the preset circuit 28 may perform a calculation determining the proper segment to initially set the VCO 24. Or, the preset circuit 28 may take the form of a lookup table that compares a reference frequency (or other frequency related parameter) to preset values, and based upon that comparison select a proper initial segment at which the VCO 24 should operate.

Alternatively, the preset circuit 28 may not necessarily determine an exact initial segment at which to operate. In this mode, the preset circuit 28 makes an initial determination of the segment, which is then ultimately relayed to the VCO 24. At this point, the selected segment is tested as being the correct segment, much as described before in terms of the conventional means of testing an individual segment. If the segment is not the proper segment, a linear search of the succeeding segments or preceding segments, as appropriate based upon whether the initial segment is too high or too low, is initiated. In this manner, many inappropriate segments in a linear search are properly not considered based upon the operation of the preset circuit 28.

In another embodiment, the same initial selection can be made by the preselection circuit. If the segment that is initially considered is not proper, it can be determined if the initial selected segment is too high or too low. With this information, a binary search could be employed to find the proper segment.

In still yet another embodiment, the system may have a preset characteristic of the frequency difference between the segments. This difference could be a single value applicable to all the segments, or discrete differences between particular segments.

Based upon one or more of: a) the initial segment selection; b) the inter-segment frequency difference; c) the difference between the expected frequency and the resulting frequency at the selected segment; and d) a test of the output frequency of the initial segment selection at various points, a new resulting segment can be determined by the system. In this manner, the rote search of segments can be obviated to a more directed selection process.

Figure 5:
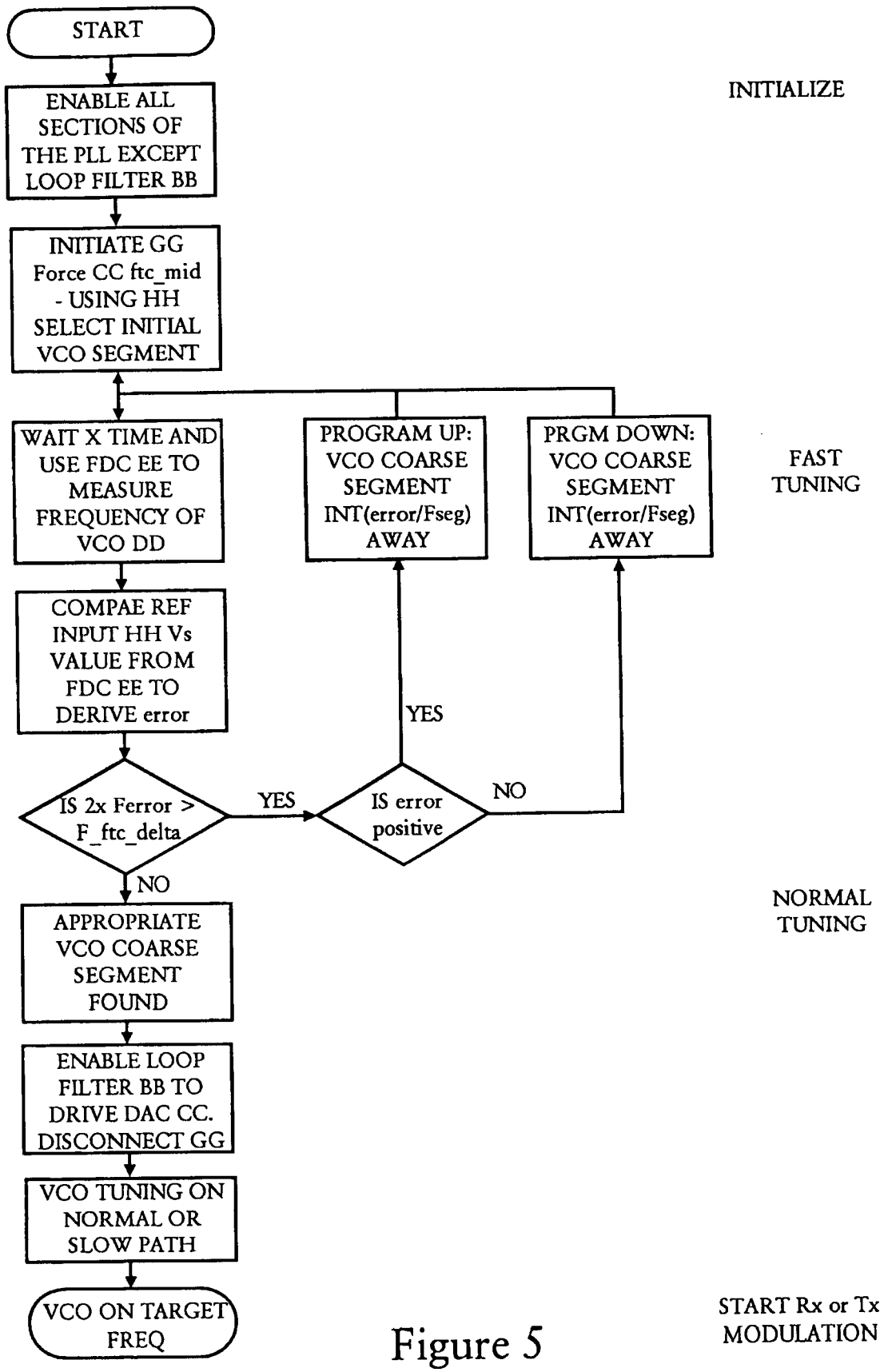
FIG. 5 is a flow chart showing how a segment can be selected.

FIG. 5 is a flow chart showing how a segment can be selected. In this manner, the segment selection process is twofold: 1) a coarse determination of the proper segment; and 2) a succeeding fine-tune selection based upon the coarse determination.

Figure 1:
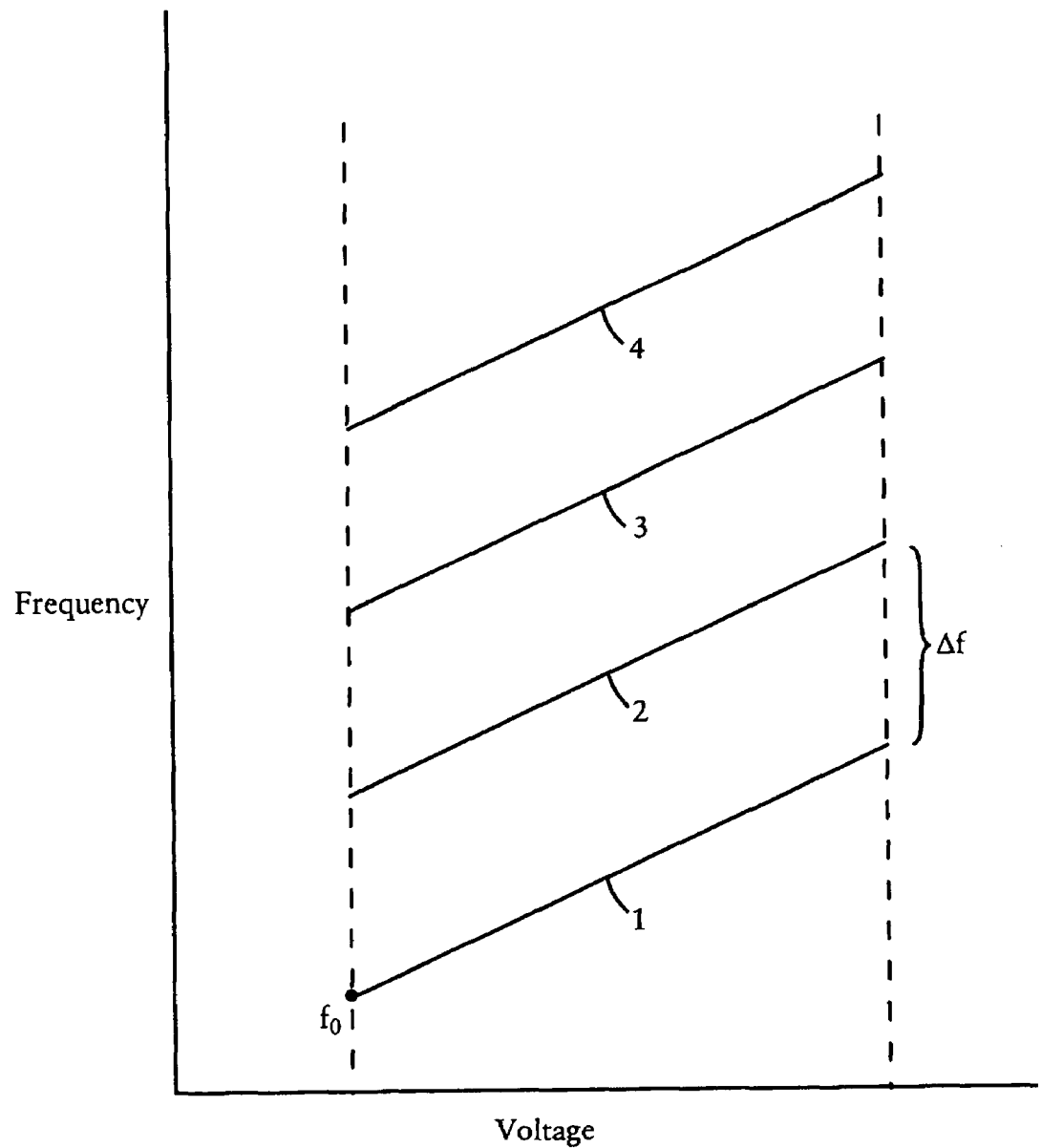
FIG. 1 is a graph depicting an output frequency of a multilevel VCO graphed against input voltages.
Figure 2:
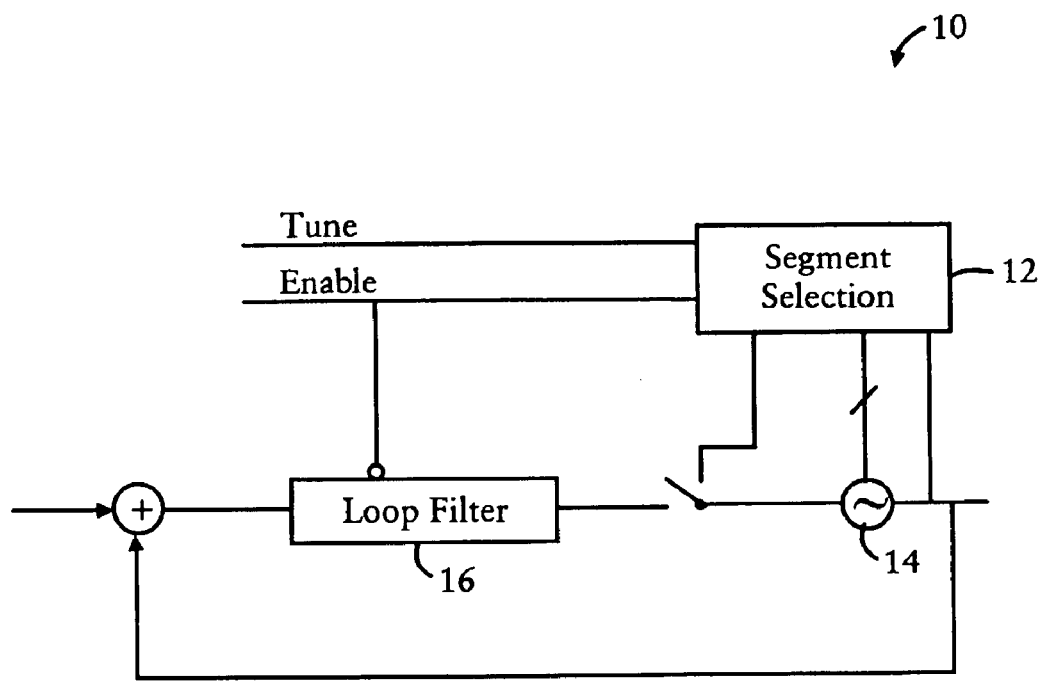
FIG. 2 is a schematic block diagram of a conventional communications system employing a variable segment VCO.

Using FIG. 1 in conjunction with FIG. 3, an exemplary operation of a multi-segment or variable segment VCO can be described. In FIG. 1, one will notice that the frequency difference between the various segments is Δf. This Δf between the segments, or between the individual segments, can be determined through pre-calibration or through direct measurements involving the preset circuit 28, the segment selection circuit 22, and the VCO 24, all of FIG. 3.

In an exemplary embodiment, the preset circuit 28 could determine the frequency value of the lowest segment operating at the lowest voltage. Accordingly, the low voltage point for each segment as depicted in FIG. 3 can be approximated with an initial frequency of $F_0+n\Delta f$, where $F_0$ is the frequency of the lowest segment at the lowest voltage, Δf is the expected frequency difference between the various segments, and n is an integer denoting which segment is being used. Thus, the preset circuit 28 can determine which segment is the best expected segment to operate at given a specific expected output frequency.

Of course, other determinations could be made using the midpoint frequency the segments or of any particular segment, the high voltage frequency of the segments, or any combination of frequencies at specific voltages for specific segments. Additionally, the specific Δf between any two segments may differ, and as such, even this may be accounted for in a calibration step or through the use of a lookup table. Further, any use of any lookup table may be further refined by comparing the outputs of specific voltages at specific segments and comparing them to an expected result. In this manner, even the use of a lookup table may be enhanced through the use of a dynamic compensation determination.

Of course other functions are available using other parameters associated with the segments, the operating voltage, the frequency characteristics of the segments (both generally and particular), the shape or slope of the segments, and the various frequencies attained by specific points on specific segments. Other operations could involve the slope of the VCO segments, the output frequency of each segment at particular voltages, the frequency at center voltages for each segment, and the frequency ranges for each segment. Of course other parameters may be employed and the preceding list should be regarded as exemplary in nature and not an exhaustive listing of all possibilities. One can ascertain that various functions using various parameters associated with the operating voltage of the oscillator, the characteristics of the segments, or the operating characteristics of a driving loop filter could be used to enable the preset circuit to make such a determination.

Figure 6:
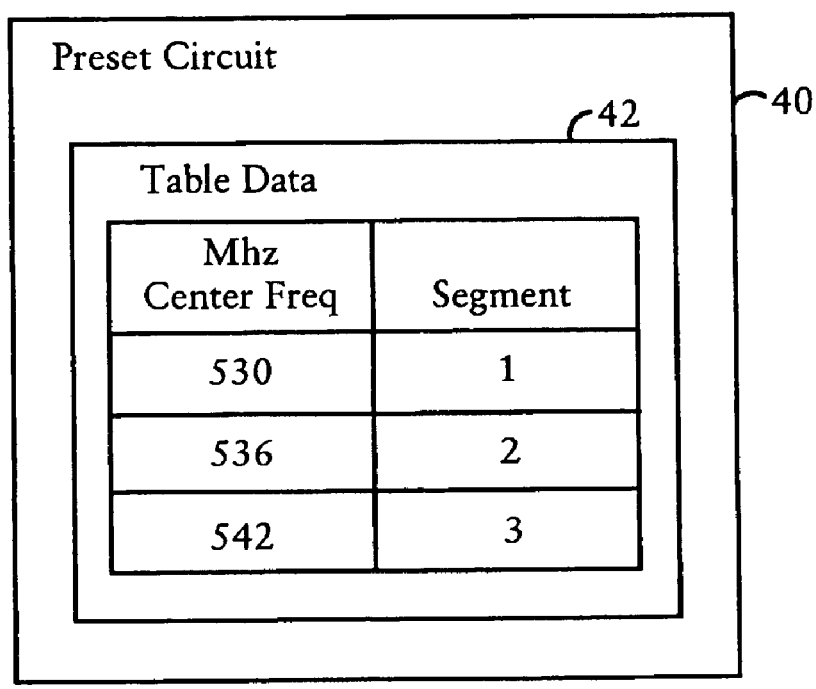
FIG. 6 is a schematic block diagram of a possible preset circuit using a lookup table to derive a proper segment at which a variable segment VCO will operate.

FIG. 6 is a schematic block diagram of a possible preset circuit using a lookup table to derive a proper segment at which a variable segment VCO will operate. A preset circuit 40 has an input and an output. The preset circuit 40 contains or has access to a lookup table 42. The preset circuit 40, upon receiving an indication of an expected output frequency from the communications device, compares the expected output frequency to a pre-stored segment center frequency. For example, in FIG. 6, assume that the input to the preset circuit 40 represents an expected frequency of 536.5 megahertz. After comparing in the lookup table 42, the preset circuit outputs a signal corresponding to the center frequency that is closest to the input. In this case it would be segment 2 having a segment center frequency of 536 megahertz. This assumes that the preset circuit has a pre-configured lookup table, or can readily build such a lookup table through a sample and test procedure prior to full operation. It should be noted that such a calibration could be performed prior to shipping a communications device, during downtimes when the communications device is in a standby mode, or otherwise not being used on an active basis.

As alluded to before, the use of the center frequency is exemplary in nature, and that other comparisons could be made that would be equally valid. The lookup table could contain frequency information for any frequency point of any segment, and the preset circuit using the lookup table could be used to compare mathematical determinations using the values in the table in addition to straight comparisons of the values themselves.

Figure 7:
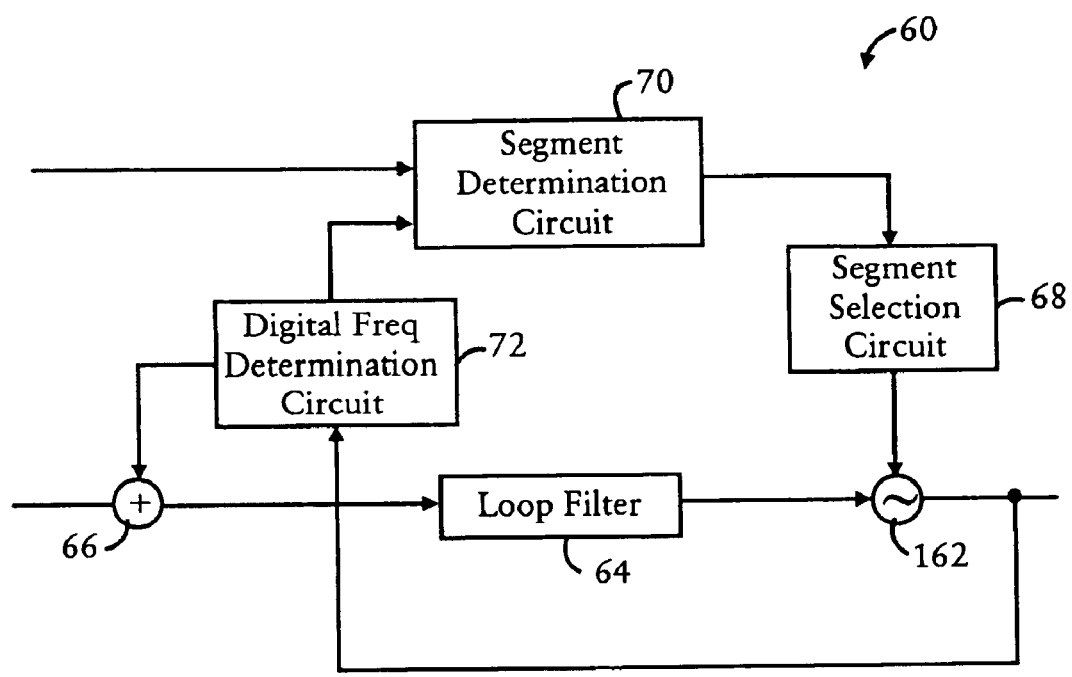
FIG. 7 is a schematic block diagram of another exemplary communications device employing segment selection for a variable segment VCO.

FIG. 7 is a schematic block diagram of another exemplary communications device employing segment selection for a variable segment VCO. A communications device 60 has a VCO 162, a loop filter 64, and a comparator 66. The VCO 162, the loop filter 64, and the comparator 66 operate to control the frequency, phase, or phase characteristic output of the VCO 162. As stated before this may be implemented in terms of a phase-lock loop or other frequency-related control loop.

A segment determination circuit 70 outputs a signal to a segment selection circuit 68. In this manner, as described above, the particular segment at which the communications device 60 is set to initially operate can be pre-selected. As noted above, the segment selection circuit 68 outputs a selection to the VCO 162 in order to pre-select the particular segment prior to operation.

As the communications device 60 enters normal operation, the segment determination circuit 70 and the segment selection circuit 68 are disabled. Concurrently or within a short time of that, the control loop using the VCO 162 the loop filter 64, and the comparator 66 is made operational.

As the communications device 60 operates, an output of the VCO 162 is relayed to a frequency determination circuit 72. The output of the frequency determination circuit 72 is an indication of the output frequency of the VCO 162. The indication of the frequency determined by the frequency determination circuit 72 is made available to the segment determination circuit 70. The segment determination circuit 70 can compare the actual output frequency, which can actuate the segment selection circuit 68 in order to change the segment that the VCO 162 operates on.

The frequency determination circuit 72 can be built having an analog or digital output, although a digital output would be easier to manipulate and use. The output of the frequency determination circuit 72 need not be sent solely to the segment selection circuit 68. The output could be used in the loop structure that ultimately drives the VCO 162, although it is not necessary for that purpose.

For example, the indication of the frequency emanating from the digital frequency determination circuit 72 may indicate an operation at a frequency $F_2$. Assume that the frequency $F_2$ is at an upper portion of a VCO segment (i.e. nearing an upper frequency limit of the segment). The segment determination circuit 70 can, in a case like this or similar to this, relay a signal to the segment selection circuit 68 to change the segment that the VCO 162 operates at in order to enable the VCO 162 to operate in a more efficient or more controlled fashion. The frequency determination circuit 72 may utilize lookup tables or it may perform calculations for the determination of whether to change the VCO segment based upon the location of the frequency on the particular segment.

In some cases, the change of segment may involve a direct determination of the particular segment, as noted in this description. Or, the segment determination may involve just a simple change to a succeeding or preceding segment.

One will note that a particular frequency may be operated on more than one segment. In fact, operation at a particular frequency may be possible on two, three, or even more segments. In practice, operations at different portions of segments may be more advantageous that at others. For example, the VCO may be one where the operation of the phase-lock loop (or other frequency-related control loop) may be more efficient towards the middle of a segment (or any other portion of the segment, for that matter). In this case, the selection could determine on which segment the particular frequency is closest to the midpoint (or other point meeting criteria), and select that segment as the operating segment.

Or, the VCO might have better tuning characteristics at one end of the segment as opposed to another. In these cases, given as examples, the selection of the particular VCO segment could involve the selection of the segment based upon the particular point in the segment which allows such performance, or allows for the best choice amongst performance characteristics.

One should note that the ability to select the segment based upon performance characteristics is not limited to the selection of the segment during operation. This function could be performed with the initial selection prior to the normal operation as well, as described infra.

Figure 8:
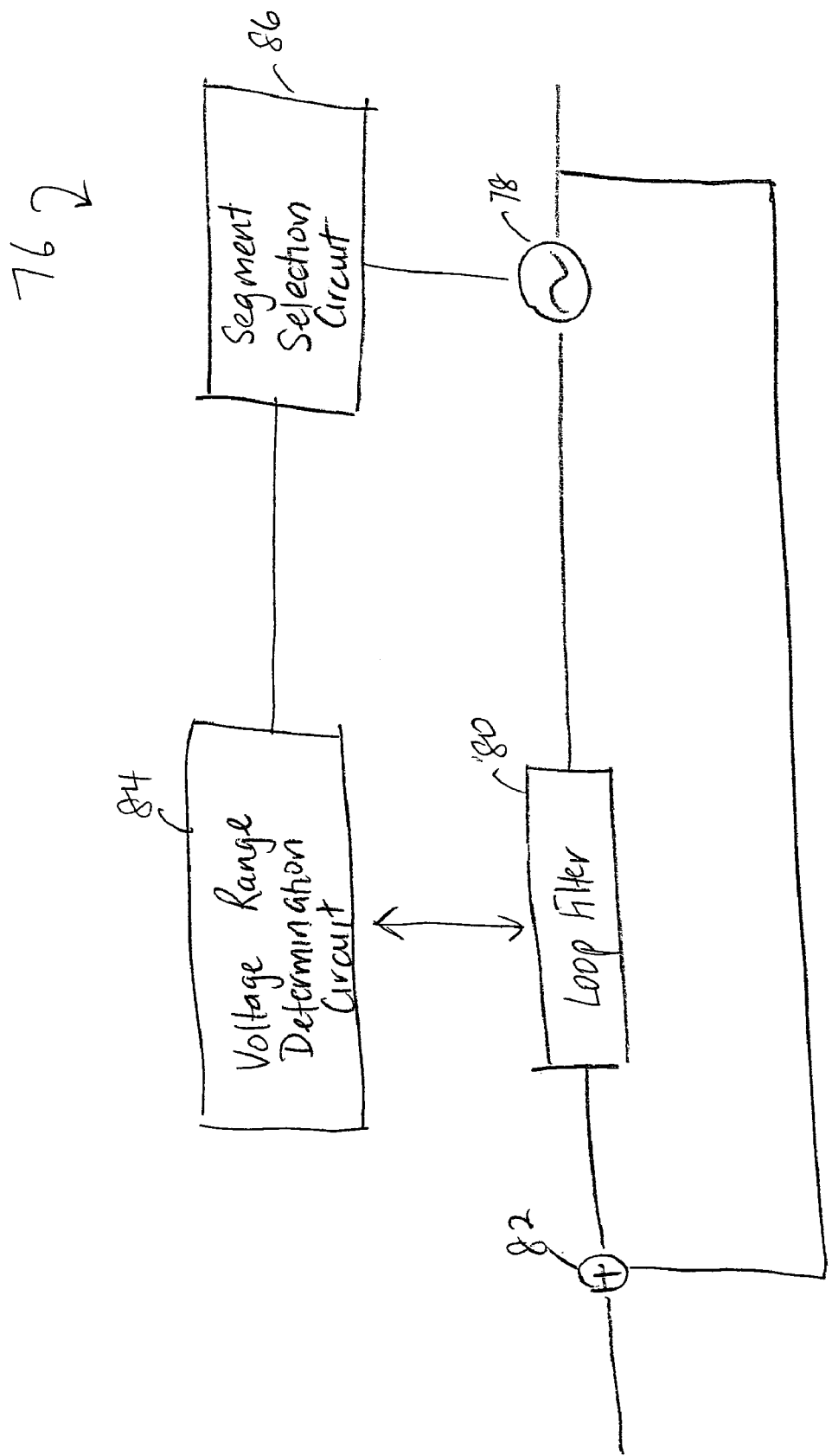
FIG. 8 is an exemplary embodiment of another communications device employing a variable segment VCO.

FIG. 8 is an exemplary embodiment of another communications device employing a variable segment VCO. A communications device 76 has a VCO 78, a loop filter 80, and a comparator circuit 82. Again the VCO 78, the loop filter 80, and the comparator circuit 82 all operate in order to control some frequency or phase characteristic associated with the output of the VCO 78. Many loop filters have a specific voltage range to which control the output of the VCO 78. In this case the loop filter 80 may be associated with a voltage range detection circuit 84 in which the output (or expected output) to the VCO 78 is compared with either a minimal or a maximal voltage value associated with the loop filter 80. Based upon some predetermined relationship between the output of the loop filter 80 and the voltage limits in which it operates, the voltage range detection circuit 84 could output a signal to a segment select circuit 86 to enable a new segment. In this manner when there is a possibility of approaching or encroaching some boundary of the voltage output of the loop filter 80, the segment selection circuit 86 can dynamically change the segment at which the VCO 78 operates.

Alternatively, the voltage range detection circuit 86 may send a signal back to the loop filter 80. In this case, the loop filter 80 could actuate a change in the segment at which the VCO 78 operates.

Of course, the examples shown are typically involved in the transmit portion of a communications device. The principles described in VCO management are equally applicable to receivers and transceivers as well.

Thus, an apparatus and method for operating a variable segment oscillator is described and illustrated. Those skilled in the art will recognize that many modifications and variations of the present invention are possible without departing from the invention. Of course, the various features depicted in each of the Figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims. Accordingly,

I claim:

1. A variable segment oscillator comprising:
   an oscillator having a plurality of segments;
   a frequency determination circuit operable to receive a first signal which is outputted from the oscillator, thereby detecting operating frequency information of the oscillator from the first signal;
   a segment determination circuit operable to receive a second signal indicative of an expected operating frequency, and to generate a segment selection signal based on the operating frequency information of the oscillator which is detected by the frequency determination circuit; and
   a segment selection circuit operable to cause the oscillator to perform an operation at a particular segment among the plurality of segments based on the segment selection signal, wherein
   every time the expected frequency characteristic is changed to update the second signal, the following processing is executed:
   1) the segment selection circuit causes the oscillator to operate at an initial segment, and receives operating frequency information indicative of an operating frequency $F_1$ of the oscillator from the frequency determination circuit;
   2) the segment selection circuit causes the oscillator to operate at a segment adjacent to the initial segment, and receives operating frequency information indicative of an operating frequency $F_2$ of the oscillator from the frequency determination circuit;
   3) the segment determination circuit calculates a frequency difference ($=F_2-F_1$) between the adjacent segments, which is defined as a first frequency difference;
   4) the segment determination circuit calculates a frequency difference ($=F_{expect}-F_1$) between an expected operating frequency $F_{expect}$ and the operating frequency $F_1$ of the oscillator at the initial segment, which is defined as a second frequency difference; and
   5) the segment determination circuit divides the second frequency difference ($F_{expect}-F_1$) by the first frequency difference ($F_2-F_1$), and receives the segment selection signal based on a result of the division.

2. The variable segment oscillator according to claim 1, wherein,
   the first signal and the second signal are voltage signals, and
   the oscillator is a voltage-controlled oscillator.

3. The variable segment oscillator according to claim 1, wherein the segment selection circuit includes a lookup table which stores therein information indicative of a relation between a segment of the oscillator and an operating frequency of the oscillator.

* * * * *

UNITED STATES PATENT AND TRADEMARK OFFICE
CERTIFICATE OF CORRECTION

PATENT NO. : 7,427,899 B2  Page 1 of 1
APPLICATION NO. : 11/326645
DATED : September 23, 2008
INVENTOR(S) : Wayne S. Lee It is certified that error appears in the above-identified patent and that said Letters Patent is hereby corrected as shown below:

IN THE CLAIMS:

In Column 10, Line 13 (Claim 1), change "$(=F_{expect\text{-}F1})$" to --$(=F_{expect}\text{-}F_1)$--.

Signed and Sealed this

Seventeenth Day of March, 2009

JOHN DOLL
*Acting Director of the United States Patent and Trademark Office*